(12) United States Patent
Periaman et al.

(10) Patent No.: US 7,692,278 B2
(45) Date of Patent: Apr. 6, 2010

(54) STACKED-DIE PACKAGES WITH SILICON VIAS AND SURFACE ACTIVATED BONDING

(75) Inventors: Shanggar Periaman, Penang (MY); Kooi Chi Ooi, Penang (MY); Bok Eng Cheah, Penang (MY)

(73) Assignee: Intel Corporation, Santa Clara, CA (US)

( * ) Notice: Subject to any disclaimer, the term of this patent is extended or adjusted under 35 U.S.C. 154(b) by 117 days.

(21) Appl. No.: 11/642,293

(22) Filed: Dec. 20, 2006

(65) Prior Publication Data

US 2008/0150155 A1 Jun. 26, 2008

(51) Int. Cl.
*H01L 23/31* (2006.01)
*H01L 23/48* (2006.01)
*H01L 23/498* (2006.01)
*H01L 23/538* (2006.01)

(52) U.S. Cl. .......... 257/686; 257/E23.01; 257/E23.061; 257/E23.069; 257/E23.124; 257/E23.126; 257/E23.013; 257/778; 257/777; 257/706; 257/714; 257/758; 257/737; 257/723

(58) Field of Classification Search .......... 257/E23.011, 257/E23.061, E23.124, E23.126, E23.013, 257/E23.01, E21.705, 686, 777, 714, 758, 257/737, 738, 723, 778
See application file for complete search history.

(56) References Cited

U.S. PATENT DOCUMENTS

| | | | | |
|---|---|---|---|---|
| 6,924,551 | B2 * | 8/2005 | Rumer et al. | 257/688 |
| 7,279,795 | B2 * | 10/2007 | Periaman et al. | 257/777 |
| 7,355,273 | B2 * | 4/2008 | Jackson et al. | 257/686 |
| 7,413,979 | B2 * | 8/2008 | Rigg et al. | 438/667 |
| 2002/0074637 | A1 * | 6/2002 | McFarland | 257/686 |
| 2005/0275750 | A1 * | 12/2005 | Akram et al. | 348/374 |
| 2006/0290002 | A1 * | 12/2006 | Arana et al. | 257/774 |
| 2007/0023887 | A1 * | 2/2007 | Matsui | 257/686 |
| 2007/0035007 | A1 * | 2/2007 | Dietz et al. | 257/700 |
| 2007/0070673 | A1 * | 3/2007 | Borkar et al. | 365/63 |
| 2007/0222050 | A1 * | 9/2007 | Lee et al. | 257/678 |
| 2008/0032446 | A1 * | 2/2008 | Wood et al. | 438/106 |
| 2008/0042261 | A1 * | 2/2008 | Wolter et al. | 257/706 |
| 2008/0315421 | A1 * | 12/2008 | Periaman et al. | 257/758 |
| 2009/0039527 | A1 * | 2/2009 | Chan et al. | 257/777 |

OTHER PUBLICATIONS

Tadaotomo Suga and Kanji Otsuka, "Bump-less Interconnect for Next Generation System Packaging", 2001 Electronic Components and Technology Conference, © 2001 IEEE. 6pgs.
Nateka, D. et al., "Through Silicon Via Processing—Assembly and Architecture Development for a Modular Multi-die stack High Density Memory Package", Intel Assembly & Test Technology Journal, 2004, vol. 7, Roadmap & Pathfinding, p. 23-30.

* cited by examiner

*Primary Examiner*—Alexander O Williams
(74) *Attorney, Agent, or Firm*—Buckley, Maschoff & Talwalkar LLC

(57) ABSTRACT

In some embodiments, an apparatus and a system are provided. The apparatus and the system may comprise a first integrated circuit die comprising a plurality of silicon vias and a first surface activated bonding site coupled to the plurality of silicon vias, and a second integrated circuit die comprising a second surface activated bonding site coupled to the first surface activated bonding site. The first surface activated bonding site may comprise a first clean metal and the second surface activated bonding site may comprise a second clean metal. If the first surface activated bonding site is coupled to the second surface activated bonding site respective metal atoms of the first activated surface activated bonding site are diffused into the second surface activated bonding site and respective metal atoms of the second activated surface activated bonding site are diffused into the first surface activated bonding site.

9 Claims, 12 Drawing Sheets

STACKED-DIE PACKAGES WITH SILICON VIAS AND SURFACE ACTIVATED BONDING

BACKGROUND

Many systems exist for packaging two or more integrated circuit (IC) dice. These multi-die systems may electrically couple the IC dice to each other and to various external elements.

For example, a Package on Package (PoP) system comprises a first IC package mounted onto a second IC package, with solder balls of the first package coupled to electrical contacts located on an upper surface of the second IC package. A Folded Stack-Chip Scale Package (FS-CSP) includes a first IC package is mounted to a first side of a substrate at one end of the substrate. The other end of the substrate is folded over the top of the first IC package to couple the first side of the substrate to the top of the first IC package. A second IC package is thereafter coupled to a second side of the substrate above the first IC package.

Conventional multi-die systems are often inadequate for one or more reasons. Specifically, such systems may require long trace lengths between active circuitry of each included IC die, may not provide desired I/O density, and/or may consume too large a footprint or volume. Systems are desired that may address one or more deficiencies of conventional multi-die systems.

DETAILED DESCRIPTION

Figure 1:
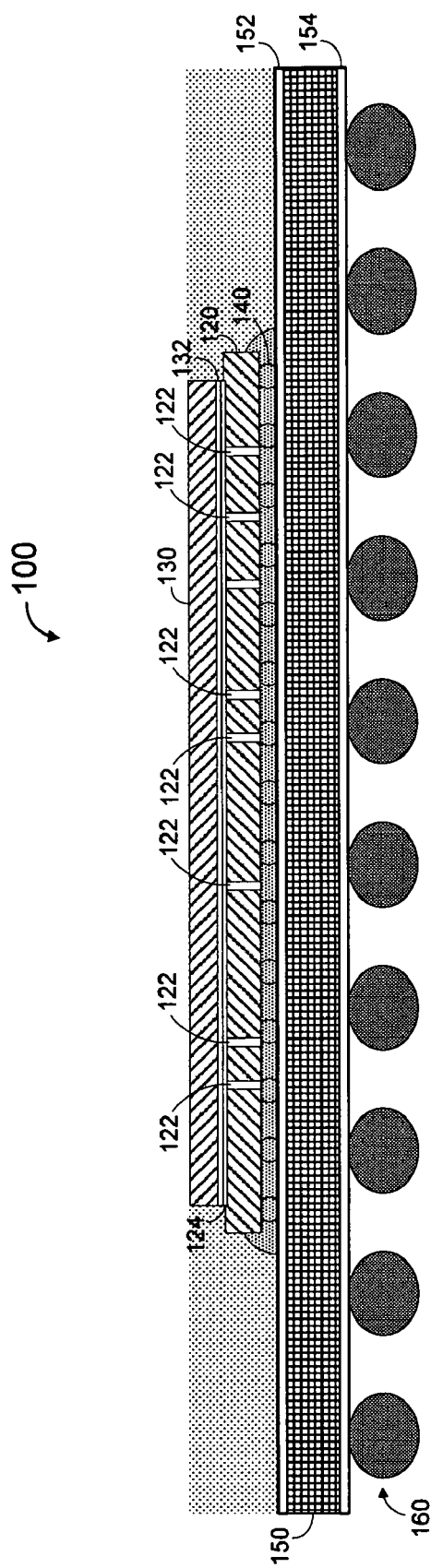
FIG. 1 is a side cross-sectional view of an apparatus according to some embodiments.

FIG. 1 is a cross-sectional side view of apparatus 100 according to some embodiments. Apparatus 100 includes first IC die 120 and second IC die 130. According to some embodiments, IC dice 120 and 130 include integrated electrical devices for providing desired functionality and may be fabricated using any suitable materials and fabrication techniques. First IC die 120 comprises silicon vias 122 and surface activated bonding site 124. Second IC die 130 includes surface activated bonding site 132 coupled to surface activated bonding site 124 of first IC die 120.

Silicon vias 122 may comprise any type or form of silicon vias that is or becomes known. In some embodiments, silicon vias 122 comprise electrically-conductive (e.g., metal) elements passing completely through IC die 120. As will be described below, vias 122 may be fabricated by creating holes in IC die 120 and filling or plating the holes with metal. Silicon vias 122 may operate to connect integrated circuitry of IC die 130 directly to solder bumps 140, which in turn are directly connected to conductive traces of routing layer 152 of IC package substrate 150.

Surface activated bonding sites 124 and 132 may comprise two clean metals that are coupled at moderate temperatures such that respective metal atoms of each metal diffuse into the other metal. Interconnecting IC die 120 and IC die 130 using surface activated bonding may provide robust communication linkages there between as well as high I/O density. Further details of sites 124 and 132 will be described below.

As mentioned above, IC package substrate 150 is coupled to vias 122 through routing layer 152 and solder bumps 140. IC package substrate 150 may include a base dielectric layer with conductive layers fabricated thereon and separated by additional dielectric layers. The dielectric layers may be composed of any suitable material, including but not limited to bismaleimide triazine (BT) and FR4 in some embodiments. The conductive layers may comprise reference planes for supplying reference voltages to electrical components that are connected to IC package substrate 150, or routing layers including conductive traces for carrying electrical signals between such electrical components. Routing layer 154, for example, may carry electrical signals between IC package 150 and solder balls 160.

Solder balls 160 may be are coupled to a substrate such as a motherboard to carry power and other electrical signals between elements of apparatus 100 and external devices. Solder balls 160 may be mountable directly to a motherboard (not shown) or onto an interposer that is in turn mounted directly to a motherboard. Alternative interconnects such as through-hole pins may be used instead of solder balls 160 to mount apparatus 100 to a motherboard, a socket, or another substrate.

Some embodiments of the apparatus 100 may provide improved communication speed and efficiency between IC dice 120 and 130 and/or increased I/O density. Some embodiments may also reduce thermal stresses between IC dice 120 and 130.

Figure 2:
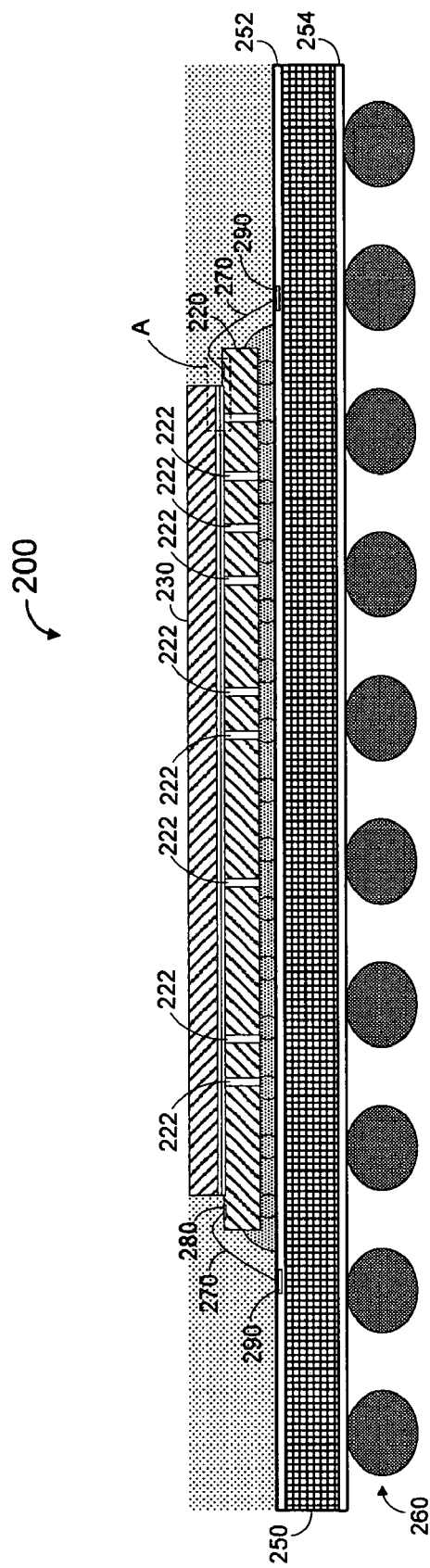
FIG. 2 is a side cross-sectional view of an apparatus according to some embodiments.

FIG. 2 illustrates apparatus 200 according to some embodiments. Elements of apparatus 200 may be similar to similarly-numbered elements of apparatus 100. Apparatus 200 also includes wirebonds 270 coupled to contacts 280 of IC die 220 and to contacts 290 of IC package substrate 250. Wirebonds 270 may provide increased I/O density to apparatus 200. Wirebonds 270 may carry I/O signals, power signals or ground signals between IC die 220 (and IC die 230) and IC package substrate 250.

Figure 3:
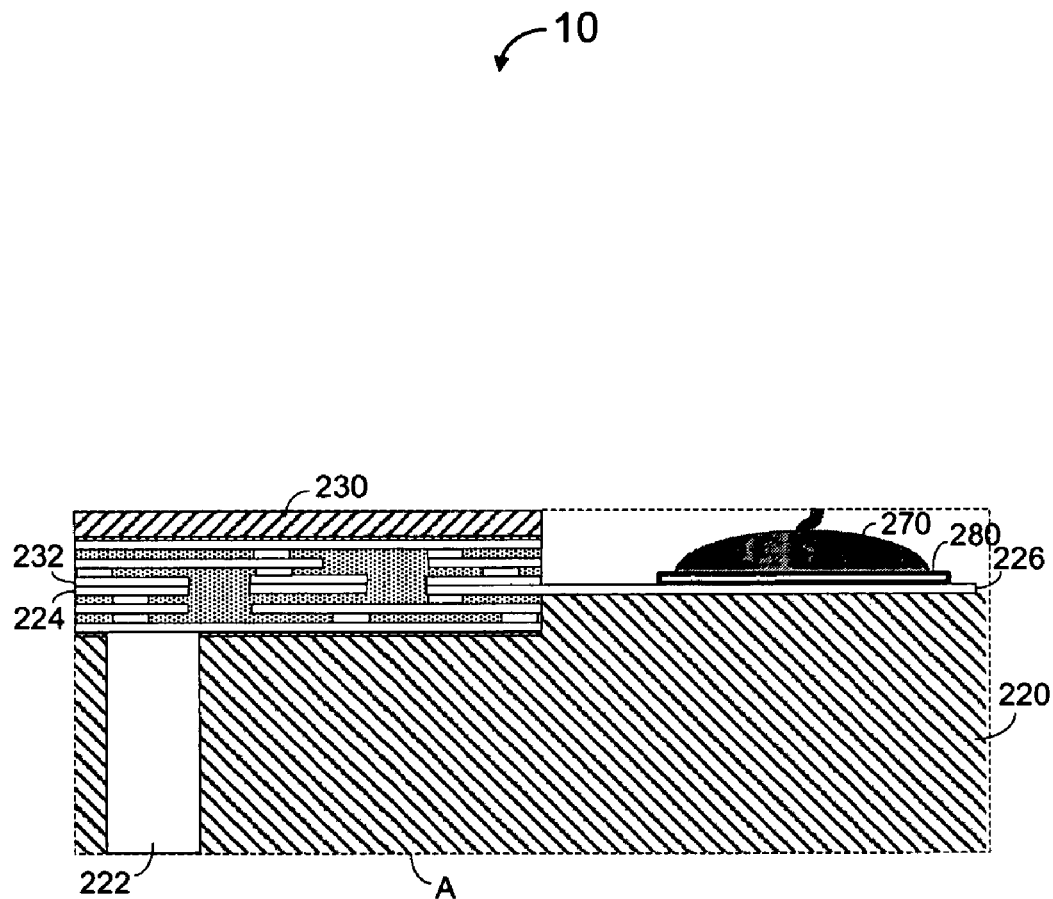
FIG. 3 is a detailed side cross-sectional view of a wirebond site, a surface activated bonding site and a silicon via according to some embodiments.

FIG. 3 is a detailed cross-sectional view of area A 10 of FIG. 2. FIG. 3 shows a portion of IC die 220 and one silicon via 222 formed therein. Also shown are wire pad 226 and metal pad contact 280. Wirebond 270 is coupled to metal pad contact 280. Wire pad 226 may reduce stress to active metal layers of IC due 220 while providing an electrical connection to wirebond 270. Except for wire pad 226, wirebond 270, and metal pad contact 280, FIG. 3 may also represent a corresponding area of apparatus 100 of FIG. 1.

IC die 220 includes surface activated bonding layer 224 and five layers disposed between layer 224 and silicon via 222. Similarly, IC die 230 includes surface activated bonding layer 232 and five layers disposed above layer 232. Moving away from each surface activated bonding layer, the next five layers comprise a dielectric layer including conductive vias, a conductive routing layer, another dielectric layer including conductive vias, a next conductive routing layer, and an active metal layer.

Some embodiments of the FIG. 3 arrangement provide a reduction in a number of metal layers used at the interface of IC die 220 and IC die 230. For example, conventional IC die may comprise seven or eight layers at a die-to-die interface to address assembly stress and high bump pitch technology limitations. A surface activated bonding interface such as that shown in FIG. 3 may reduce thermal stresses between the adjacent IC die and may provide lower interconnect pitch.

Figure 4:
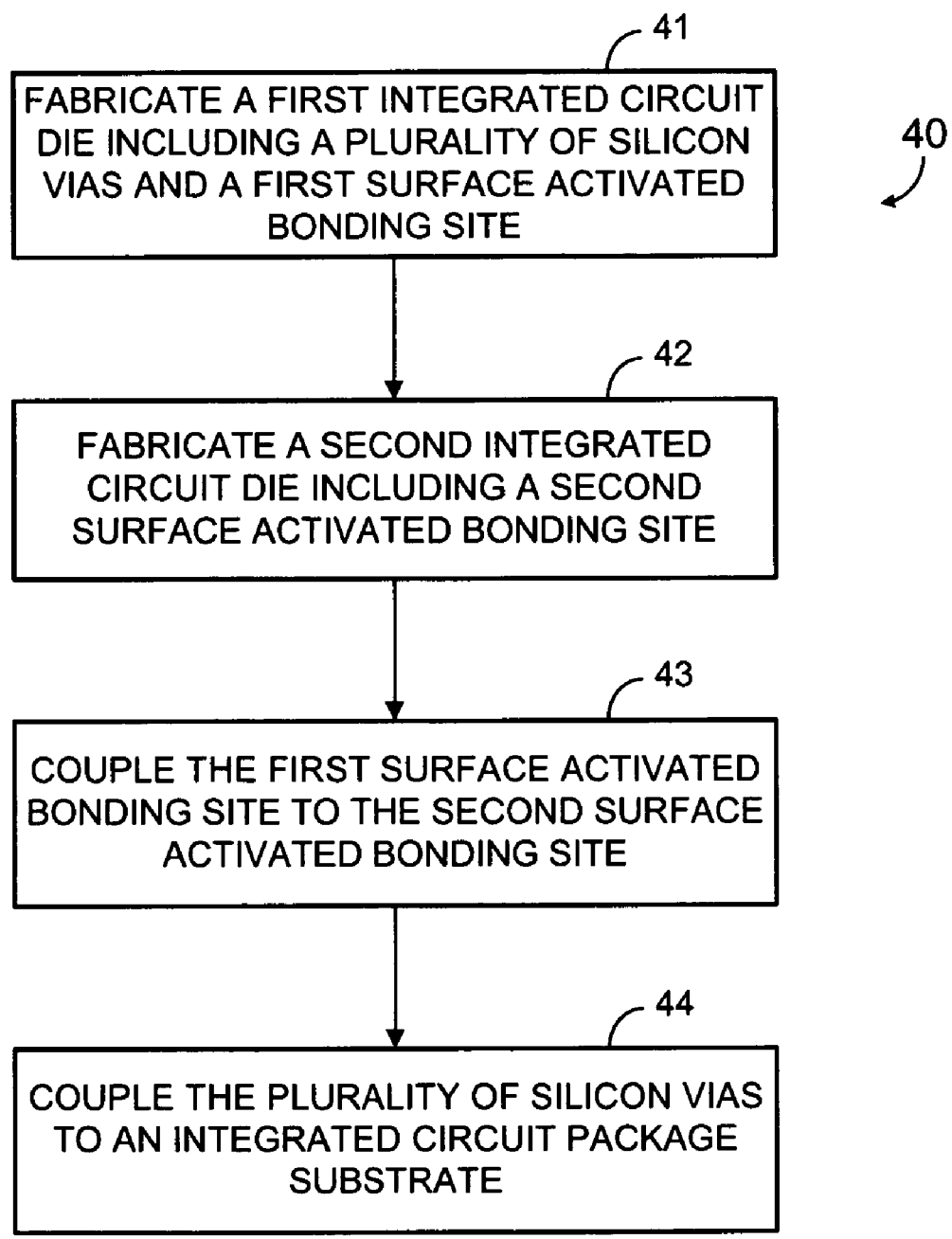
FIG. 4 is a flow diagram of a process according to some embodiments.

FIG. 4 is a diagram of process 40 to fabricate an apparatus according to some embodiments. Process 40 may be executed by one or more devices, and all or a part of process 40 may be executed manually. Process 40 may be executed by an entity different from an entity that manufactures any IC die used therein.

Initially, at 41, a first IC die is fabricated. The first IC die includes a plurality of silicon vias and a first surface activated bonding site. A second IC die is then fabricated at 42. The second integrated circuit die includes a second surface activated bonding site.

The first and second IC die may provide any suitable functions and may be fabricated using any suitable materials and processes. According to some embodiments, the first IC comprises a chipset and the second IC die comprises a microprocessor.

Figure 5A:
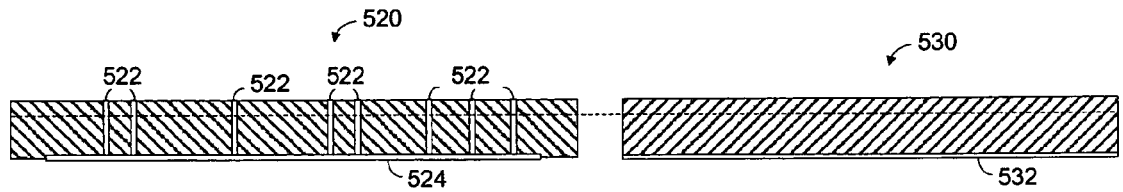
FIGS. 5A through 5F illustrate fabrication of an apparatus according to some embodiments.

FIG. 5A includes cross-sectional views of first die 520 and second die 530 according to some embodiments. IC die 520 includes silicon vias 522 and surface activated bonding site 524. Second IC die 530 includes surface activated bonding site 532. Silicon vias 522 may be fabricated using any process or material that is or becomes known. Similarly, surface activated bonding sites 524 and 532 may implement any suitable surface activated bonding configurations and/or technologies, including but not limited to surface-activated copper. FIG. 5A shows a dashed line depicting wafer thinning that may be employed at 41 and/or 42. IC die 520 and IC die 530 need not be of identical thickness according to some embodiments.

Figure 5B:
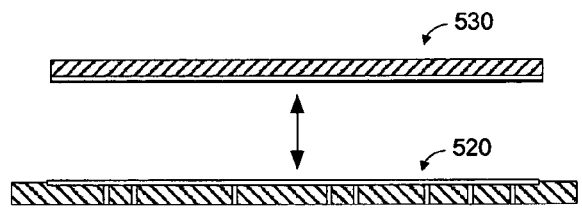
Figure 5C:
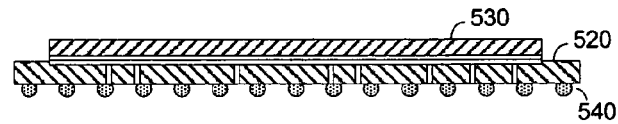
Figure 5D:
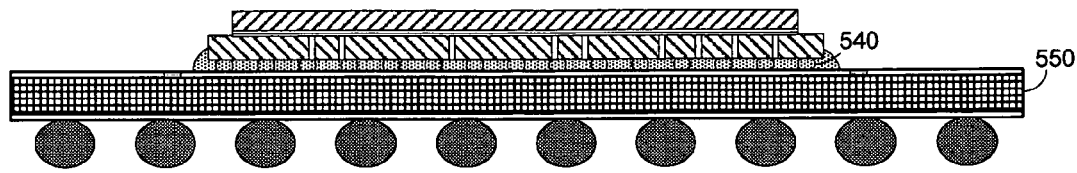

The first surface activated bonding site is coupled to the second surface activated bonding site at 43. FIG. 5B illustrates relative orientations of IC die 520 and IC die 530 according to some embodiments of 43. The bonding sites may be aligned and compressed against one another at 43 using any suitable techniques. According to some embodiments, the coupling causes metal atoms of the first and second surface activated bonding sites to diffuse into one another. FIG. 5C illustrates the coupled IC dies and also shows solder bumps 540 (e.g., C4 bumps) coupled to IC die 520. Accordingly, IC die 520 may exhibit a flip-chip arrangement including but not limited to micro-ball technology.

Next, at 44, the plurality of silicon vias is coupled to an IC package substrate. As shown in FIG. SD, vias 522 may be coupled to respective electrical contacts of package substrate 550 through solder bumps 540. As a result, IC die 530 may be provided with more direct access to package substrate 550 than otherwise available. The coupling at 44 may comprise placing solder bumps 540 on the electrical contacts of substrate 550 and reflowing solder bumps 540 to establish a robust electrical and physical interconnection.

Figure 5E:
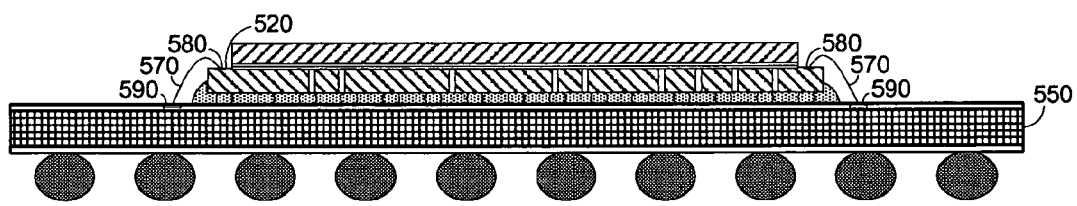
Figure 5F:
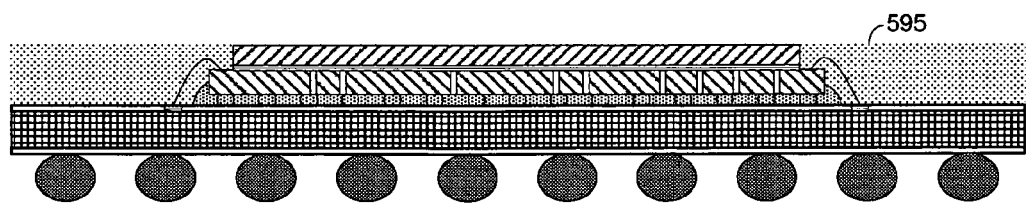

FIGS. 5E and 5F illustrate additional processes that may follow process 40 in some embodiments. FIG. 5E shows wirebonds 570 coupling electrical contacts 580 of IC die 520 to electrical contacts 590 of substrate 550 in order to provide increased I/O to IC die 530 and/or to IC die 520. Lastly, mold compound 595 may be deposited over IC die 520, IC 530 and an upper surface of substrate 550 to provide protection thereto.

Figure 6:
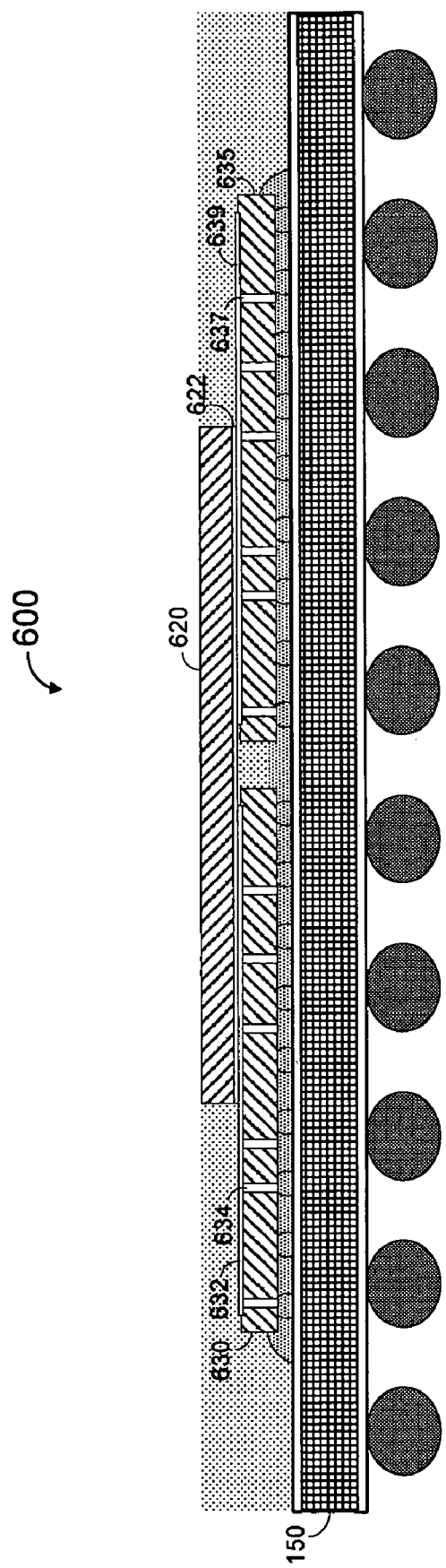
FIG. 6 is a side cross-sectional view of an apparatus according to some embodiments.
Figure 7:
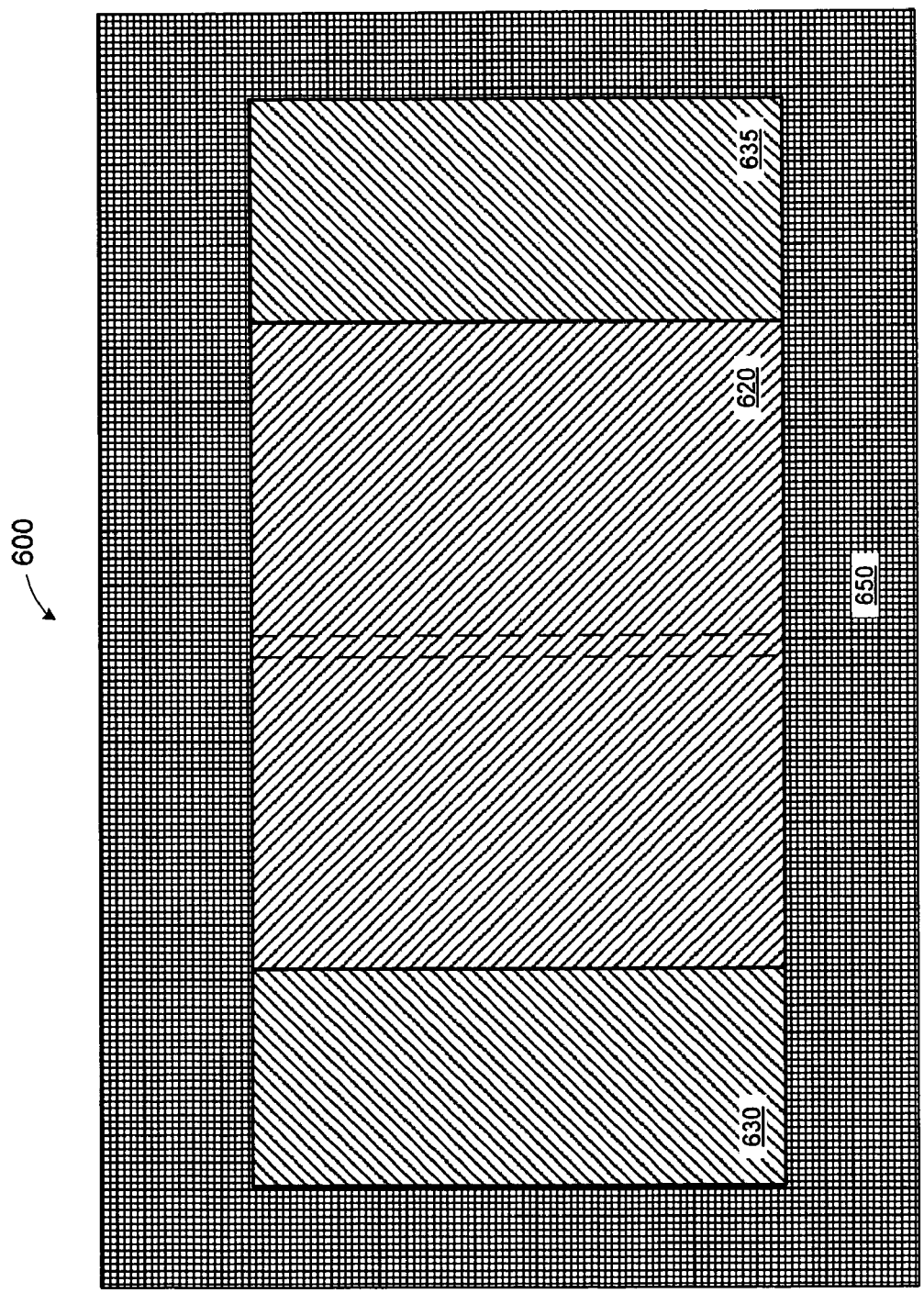
FIG. 7 is a top perspective view of an apparatus according to some embodiments.
Figure 8:
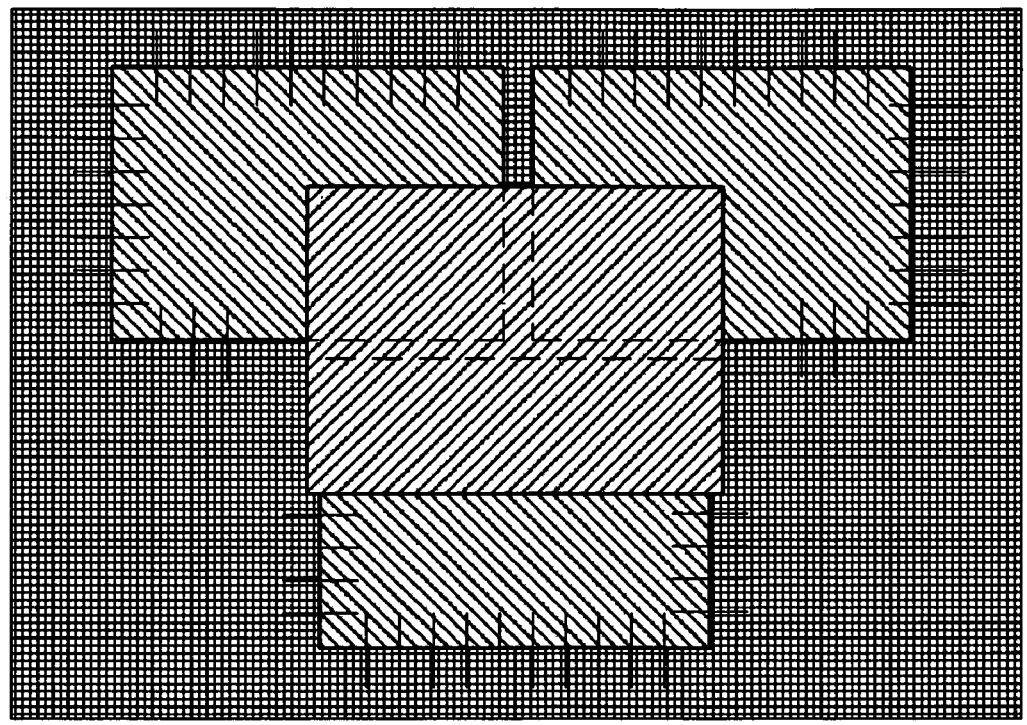
FIG. 8 is a top perspective view of an apparatus according to some embodiments.
Figure 9:
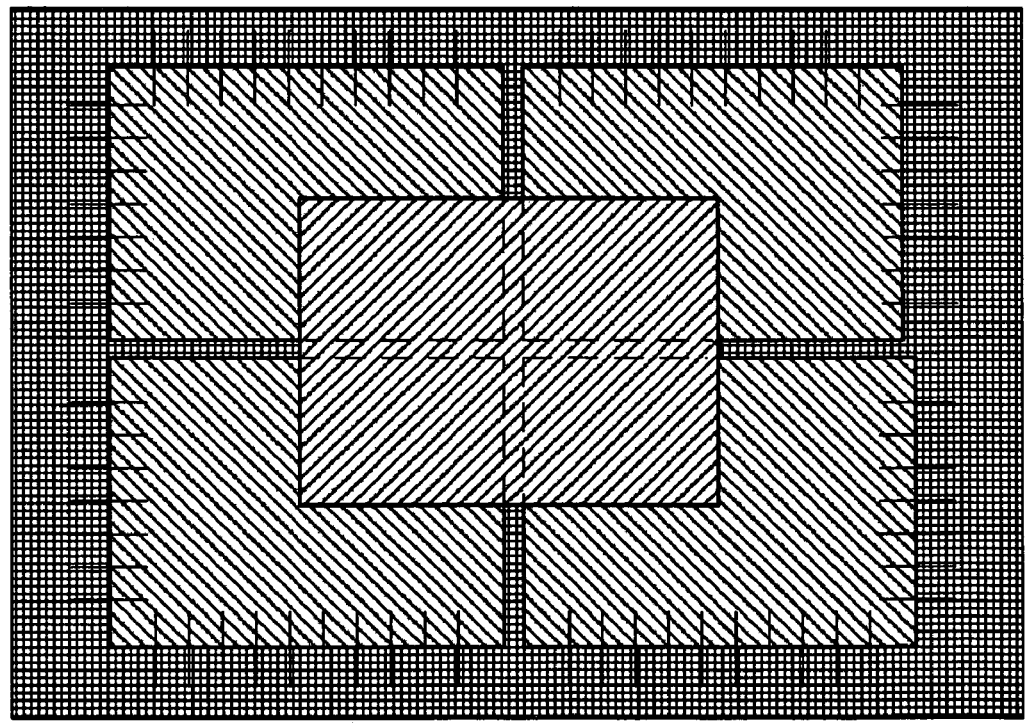
FIG. 9 is a top perspective view of an apparatus according to some embodiments.
Figure 10:
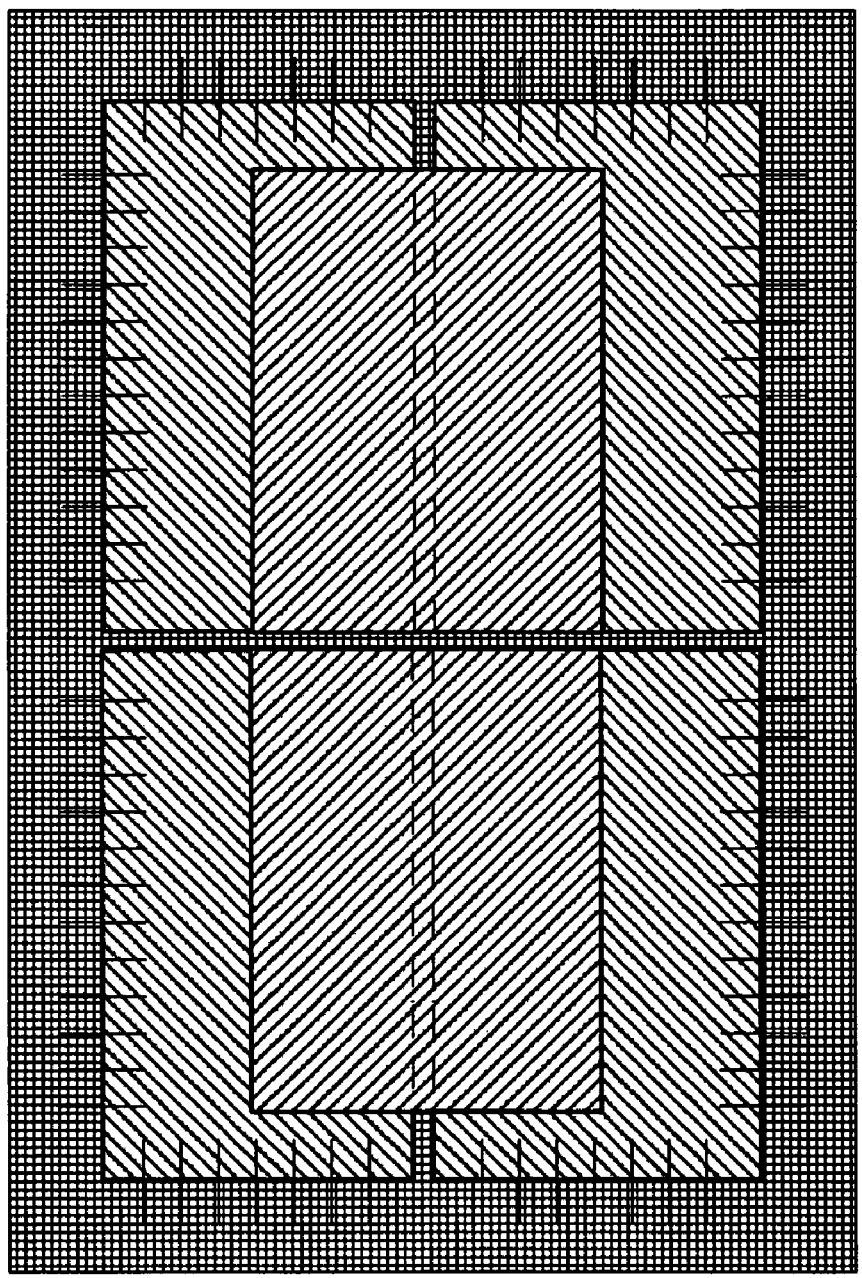
FIG. 10 is a top perspective view of an apparatus according to some embodiments.
Figure 11:
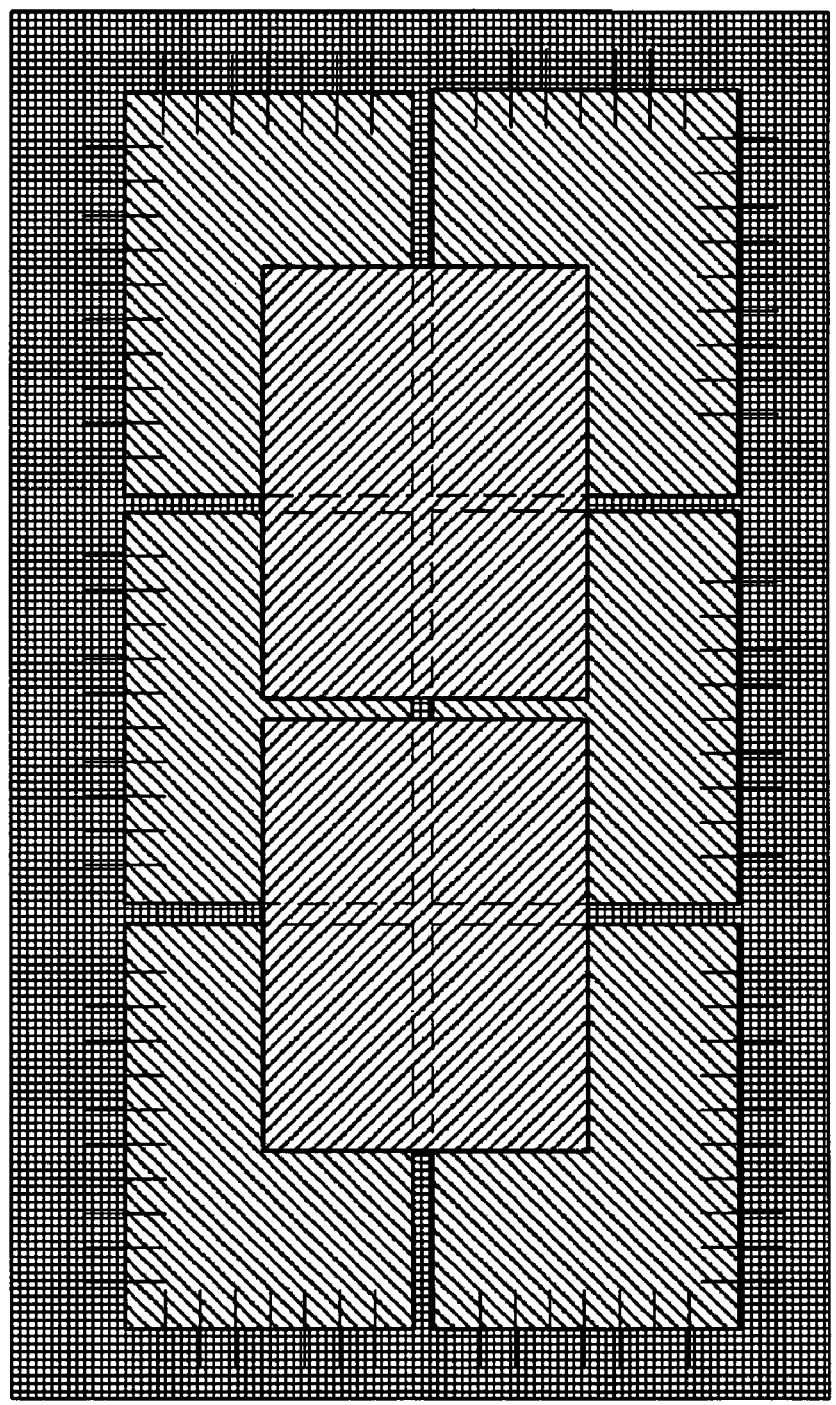
FIG. 11 is a top perspective view of an apparatus according to some embodiments.

FIG. 6 is a cross-sectional view of apparatus 600 according to some embodiments. Apparatus 600 includes IC die 620 coupled to IC die 630 and to IC die 635. FIG. 7 is a top view to further illustrate the physical relationships of the elements of apparatus 600. In some embodiments, IC die 620 comprises a dual-core server and IC dice 630 and 635 comprise chipsets.

IC die 630 comprises silicon vias 634 and surface activated bonding site 632, while IC die 635 comprises silicon vias 637 and surface activated bonding site 639. IC die 620, in turn, includes surface activated bonding site 622 that is coupled to respective areas of surface activated bonding site 632 and surface activated bonding site 639. The coupled surface activated bonding sites may be arranged as shown in FIG. 3 according to some embodiments.

FIGS. 8 through 11 comprise top views of various apparatuses according to some embodiments. The various apparatus may be fabricated using techniques such as those described with respect to process 40. One or more lower IC die of each illustrated apparatus may include a surface activated bonding site that is coupled to a corresponding surface activated bonding site of its upper IC die. One or more of the lower IC of each apparatus may also or alternatively include a plurality of silicon vias coupled to an upper IC die and to the illustrate IC package substrate. Moreover, each lower IC die is shown coupled to an IC package substrate via wirebonds, although embodiments are not limited to this arrangement. Any of the apparatuses of FIGS. 7 through 11 may include additional elements mounted on the illustrated IC package substrate.

Figure 12:
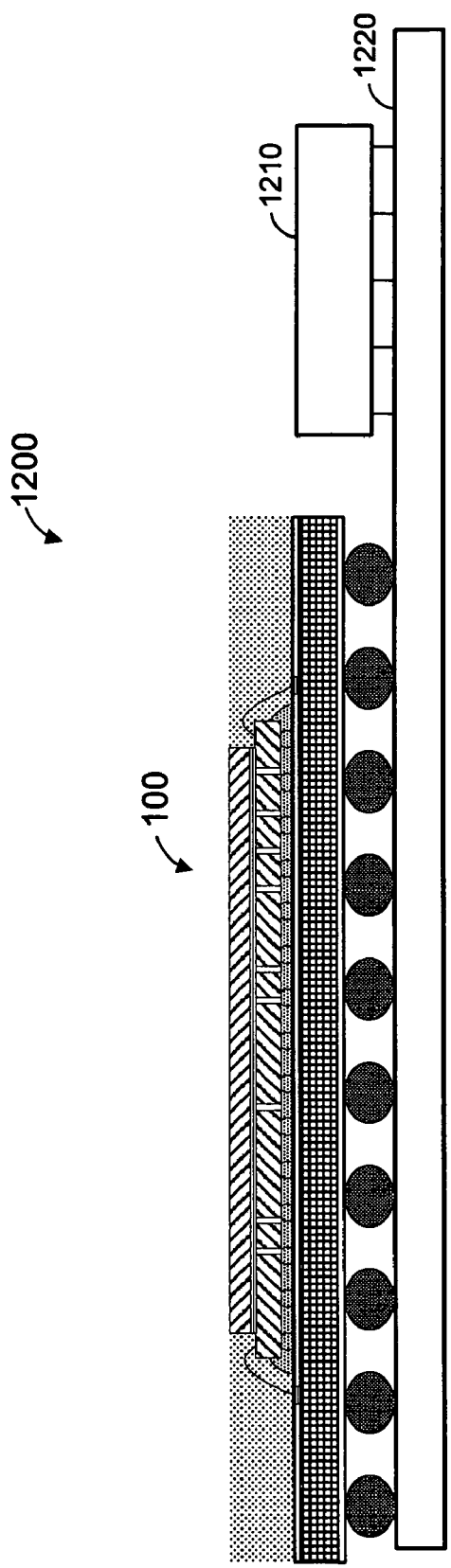
FIG. 12 is a diagram of a system according to some embodiments.

FIG. 12 is a cross-sectional side view of system 1200 according to some embodiments. System 1200 may comprise components of a server platform. System 1200 includes apparatus 100 as described above, memory 1210 and motherboard 1220. Apparatus 100 may comprise but is not limited to a microprocessor die and a chipset die.

Motherboard 1220 may electrically couple memory 1210 to apparatus 100. More particularly, motherboard 1220 may comprise a bus (not shown) that is electrically coupled to apparatus 100 and to memory 1210. Memory 1210 may store, for example, applications, programs, procedures, and/or modules that store instructions to be executed by the microprocessor die of apparatus 100. Memory 1210 may comprise, according to some embodiments, any type of memory for storing data, such as a Single Data Rate Random Access Memory (SDR-RAM), a Double Data Rate Random Access Memory (DDR-RAM), or a Programmable Read Only Memory (PROM).

The several embodiments described herein are solely for the purpose of illustration. The various features described herein need not all be used together, and any one or more of those features may be incorporated in a single embodiment. Some embodiments may include any currently or hereafter-known versions of the elements described herein. Therefore, other embodiments may be practiced with various modifications and alterations.

What is claimed is:

1. An apparatus comprising:
  a first integrated circuit die comprising a plurality of silicon vias and a first surface activated bonding site coupled to the plurality of silicon vias; and a second integrated circuit die comprising a second surface activated bonding site coupled to the first surface activated bonding site, wherein the first surface activated bonding site comprises a first clean metal and the second surface activated bonding site comprises a second clean metal, and wherein the first surface activated bonding site is coupled to the second surface activated bonding site such that respective metal atoms of the first activated surface activated bonding site are diffused into the second surface activated bonding site and respective metal atoms of the second activated surface activated bonding site are diffused into the first surface activated bonding site.

2. The apparatus according to claim 1, further comprising:
an integrated circuit package substrate coupled to the plurality of silicon vias.

3. The apparatus according to claim 2, further comprising:
a plurality of wirebonds coupled to the integrated circuit package substrate and to the first integrated circuit die.

4. A method comprising:
fabricating a first integrated circuit die including a plurality of silicon vias and a first surface activated bonding site;
fabricating a second integrated circuit die including a second surface activated bonding site; and
coupling the first surface activated bonding site to the second surface activated bonding site,
wherein the first surface activated bonding site is coupled to the second surface activated bonding site such that respective metal atoms of the first activated surface activated bonding site are diffused into the second surface activated bonding site and respective metal atoms of the second activated surface activated bonding site are diffused into the first surface activated bonding site.

5. The method according to claim 4, further comprising:
coupling the plurality of silicon vias to an integrated circuit package substrate.

6. The method according to claim 5, further comprising:
coupling a plurality of wirebonds to the integrated circuit package substrate and to the first integrated circuit die.

7. A system comprising:
a microprocessor die comprising a plurality of silicon vias and a first surface activated bonding site coupled to the plurality of silicon vias;
a chipset die comprising a second surface activated bonding site coupled to the first surface activated bonding site; and
a double data rate memory in communication with the chipset die, wherein the first surface activated bonding site comprises a first clean metal and the second surface activated bonding site comprises a second clean metal, and wherein the first surface activated bonding site is coupled to the second surface activated bonding site such that respective metal atoms of the first activated surface activated bonding site are diffused into the second surface activated bonding site and respective metal atoms of the second activated surface activated bonding site are diffused into the first surface activated bonding site.

8. The system according to claim 7, further comprising:
an integrated circuit package substrate coupled to the plurality of silicon vias.

9. The system according to claim 8, further comprising:
a plurality of wirebonds coupled to the integrated circuit package substrate and to the first integrated circuit die.

* * * * *